(12) United States Patent
Miyazaki et al.

(10) Patent No.: US 6,448,612 B1
(45) Date of Patent: *Sep. 10, 2002

(54) PIXEL THIN FILM TRANSISTOR AND A DRIVER CIRCUIT FOR DRIVING THE PIXEL THIN FILM TRANSISTOR

(75) Inventors: Minoru Miyazaki; Akane Murakami; Baochun Cui; Mutsuo Yamamoto, all of Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/703,594

(22) Filed: Nov. 2, 2000

Related U.S. Application Data

(62) Division of application No. 09/382,674, filed on Aug. 25, 1999, now Pat. No. 6,166,414, which is a division of application No. 09/041,702, filed on Mar. 13, 1998, now Pat. No. 6,071,290, which is a division of application No. 08/636,917, filed on Apr. 24, 1996, now Pat. No. 5,804,878, which is a continuation of application No. 08/162,357, filed on Dec. 7, 1993, now abandoned.

(30) Foreign Application Priority Data

| Dec. 9, 1992 | (JP) | ............................................. 4-351916 |
| Jan. 18, 1993 | (JP) | ............................................. 5-023289 |

(51) Int. Cl.[7] .......................... H01L 27/01; H01L 27/12; H01L 31/0392

(52) U.S. Cl. ........................... 257/344; 257/57; 257/72; 257/350; 257/351; 257/408

(58) Field of Search ................................ 257/344, 408, 257/57, 72, 350, 351

(56) References Cited

U.S. PATENT DOCUMENTS

| 4,193,080 A | * | 3/1980 | Koike et al. |
| 4,517,583 A | | 5/1985 | Uchida |
| 4,783,248 A | | 11/1988 | Kohlhase et al. |

(List continued on next page.)

FOREIGN PATENT DOCUMENTS

| EP | 0 480 409 | 4/1992 |
| JP | 54-137286 | 10/1979 |
| JP | 62-259469 | 11/1987 |

(List continued on next page.)

OTHER PUBLICATIONS

Ellwanger et al., "The Deposition and Film Properites of Reactively Sputtered Titanium Nitride", pp. 289–304, 1988, Thin Solid Films, 161.

Joswig et al., "Advanced Metallization of Very–Large–Scale Integration Devices", pp. 17–22, 1989, Thin Solid Films, 175.

(List continued on next page.)

Primary Examiner—Ngân V. Ngô
(74) Attorney, Agent, or Firm—Nixon Peabody LLP

(57) ABSTRACT

An electronic circuit formed on an insulating substrate and having thin-film transistors (TFTs) comprising semiconductor layers. The thickness of the semiconductor layers is less than 1500 Å, e.g., between 100 and 750 Å. A first layer consisting mainly of titanium and nitrogen is formed on the semiconductor layer. A second layer consisting aluminum is formed on top of the first layer. The first and second layers are patterned into conductive interconnects. The bottom surface of the second layer is substantially totally in intimate contact with the first layer. The interconnects have good contacts with the semiconductor layer.

42 Claims, 8 Drawing Sheets

U.S. PATENT DOCUMENTS

| | | |
|---|---|---|
| 4,887,146 A | 12/1989 | Hinode |
| 4,928,156 A * | 5/1990 | Alvis et al. |
| 5,157,470 A | 10/1992 | Matsuzaki et al. |
| 5,182,624 A | 1/1993 | Tran et al. |
| 5,198,379 A | 3/1993 | Adan |
| 5,202,575 A | 4/1993 | Sakai |
| 5,246,872 A | 9/1993 | Mortensen |
| 5,306,651 A | 4/1994 | Masumo et al. |
| 5,316,960 A | 5/1994 | Watanabe et al. |
| 5,323,042 A * | 6/1994 | Matsumoto ................. 257/350 |
| 5,365,104 A | 11/1994 | Godinho et al. |
| 5,365,112 A | 11/1994 | Ohshima |
| 5,371,042 A | 12/1994 | Ong |
| 5,380,678 A | 1/1995 | Yu et al. |
| 5,397,744 A | 3/1995 | Sumi et al. |
| 5,412,493 A | 5/1995 | Kunii et al. |
| 5,434,044 A | 7/1995 | Nulman et al. |
| 5,459,353 A | 10/1995 | Kanazawa |
| 5,472,912 A | 12/1995 | Miller |
| 5,567,966 A * | 10/1996 | Hwang ....................... 257/347 |
| 5,623,157 A | 4/1997 | Miyazaki et al. |
| 5,644,370 A | 7/1997 | Miyawaki et al. |
| 5,677,240 A | 10/1997 | Murakami et al. |
| 5,698,883 A | 12/1997 | Mizuno |
| 5,804,878 A | 9/1998 | Miyazaki et al. |
| 5,808,315 A | 9/1998 | Murakami et al. |
| 5,808,347 A | 9/1998 | Kurimoto et al. |
| 5,938,839 A | 8/1999 | Zhang |
| 6,031,290 A | 2/2000 | Miyazaki et al. |
| 6,166,414 A | 12/2000 | Miyazaki et al. |
| 6,259,120 B1 | 6/2001 | Zhang et al. |

FOREIGN PATENT DOCUMENTS

| | | |
|---|---|---|
| JP | 63-185066 | 7/1988 |
| JP | 01-122168 | 5/1989 |
| JP | 02-271632 | 11/1990 |
| JP | 03-108767 | 5/1991 |
| JP | 03-135018 | 6/1991 |
| JP | 04-100232 | 4/1992 |
| JP | 04-112529 | 4/1992 |
| JP | 04-301623 | 10/1992 |
| JP | 05-021796 | 1/1993 |
| JP | 05-102055 | 4/1993 |
| JP | 05-210117 | 8/1993 |
| JP | 05-235360 | 9/1993 |
| JP | 05-267667 | 10/1993 |
| JP | 06-104196 | 4/1994 |

OTHER PUBLICATIONS

Specifications and Drawings for Application Ser. No. 09/190,618, "Semiconductor Device and Method for Fabricating the Same".

* cited by examiner

PIXEL THIN FILM TRANSISTOR AND A DRIVER CIRCUIT FOR DRIVING THE PIXEL THIN FILM TRANSISTOR

This application is a Division of application Ser. No. 09/382,674 filed Aug. 25, 1999; now U.S. Pat. No. 6,166,414 which itself is a Division of application Ser. No. 09/041,702 filed Mar. 13, 1998; now U.S. Pat. No. 6,071,290 which is a Division of application Ser. No. 08/636,917 filed Apr. 24, 1996 (now U.S. Pat. No. 5,804,878); which is a Continuation of application Ser. No. 08/162,357 filed Dec. 7, 1993, now abandoned.

FIELD OF THE INVENTION

The present invention relates to an electronic circuit which is formed on an insulating substrate and has a thin semiconductor layer of silicon, for example, forming thin-film transistors, the thin semiconductor layer being required to be connected with conductive interconnects.

BACKGROUND OF THE INVENTION

Conventional thin-film devices such as insulated-gate FETs use a thin semiconductor film of silicon as an active layer. This layer is about 1500 Å thick. Therefore, where electrodes should be formed on this thin semiconductor film, satisfactory contacts can be made by bringing a metal such as aluminum into direct and intimate contact with the film, in the same way as in the prior art IC fabrication techniques. In these contacts, a silicide such as aluminum silicide is usually formed by a chemical reaction between the aluminum and the semiconductor component such as silicon. Since the semiconductor layer is sufficiently thicker than the silicide layer, no problems take place.

However, researches conducted recently have demonstrated that if the thickness of the active layer is decreased below 1500 Å, for example, between about 100 to 750 Å, then the characteristics of the TFTs are improved. Where electrodes should be formed on such a thin semiconductor layer, or an active layer, it has not been possible to make good contacts by the prior art techniques, because the thickness of the silicide layer grows almost up to the thickness of the semiconductor layer, thus severely deteriorating the electrical characteristics of the contacts. When a stress such as a voltage is kept applied to the contacts for a long time, the contacts deteriorate seriously.

In order to improve the characteristics of the TFTs, thermal treatment effected below 400° C., typically 200–350° C., within hydrogen ambient is needed after formation of the electrodes on the semiconductor layer. Where the thickness of the semiconductor layer of the TFTs is less than 1500 Å, the thermal processing greatly promotes growth of the silicide, leading to deterioration of the characteristics of the TFTs.

SUMMARY OF THE INVENTION

It is an object of the present invention to provide a reliable electronic circuit having a semiconductor layer, conductive interconnects, and good contacts between the semiconductor layer and the interconnects, the contacts being capable of withstanding thermal processing performed at or above 300° C.

The present invention resides in an electronic circuit which is formed on an insulating substrate and has a semiconductor layer consisting mainly of silicon, the thickness of the semiconductor layer being less than 1500 Å, preferably between 100 Å and 750 Å. For example, the invention is applicable to an electronic circuit having TFTs each provided with an active layer having a thickness less than 1500 Å. The effects of the present invention become conspicuous as the thickness of the semiconductor layer decreases.

In a first embodiment of the invention, the above-described semiconductor. layer in the form of a thin film is either in intimate contact with the top surface of the insulating substrate as made of glass or formed over this substrate via some insulating film. A first layer consisting principally of titanium and nitrogen is partially or totally in intimate contact with the semiconductor layer. A second layer consisting principally of aluminum is formed on the top surface of the first layer. The first and second layers are photolithographically patterned into conductive interconnects. The bottom surface of the second layer is substantially totally in intimate contact with the first layer. It is possible to form a third layer consisting mainly of titanium and nitrogen on the second layer.

In another embodiment of the invention, the above-described semiconductor layer in the form of a thin film is either in intimate contact with the insulating substrate as made of glass or formed over this substrate via some insulating film. A first layer containing both titanium and silicon is partially or totally in intimate contact with the semiconductor layer. A second layer consisting chiefly of titanium and nitrogen is in intimate contact with the top surface of the first layer. A third layer consisting principally of aluminum is formed on the top surface of the second layer. The first through third layers are photolithographically patterned into conductive interconnects. Of course, other layer may be formed on the third layer.

In a further embodiment of the invention, the above-described semiconductor layer in the form of a thin film is either in intimate contact with the insulating substrate as made of glass or formed over this substrate via some insulating film. A first layer containing both titanium and silicon as main constituents is partially or totally in intimate contact with the semiconductor layer. A second layer consisting chiefly of titanium and nitrogen is in intimate contact with the top surface of the first layer. A third layer consisting principally of aluminum is formed on the top surface of the second layer. The first through third layers are photolithographically patterned into conductive interconnects. This embodiment is characterized in that the ratio of the titanium to the nitrogen in the first layer is greater than the titanium/nitrogen ratio of the second layer.

In any structure of these embodiments, the portions of the thin semiconductor film with which the first layer is in intimate contact show an N- or P-type conductivity. Preferably, the dose in these portions is $1 \times 10^{19}$ to $1 \times 10^{20}/\text{cm}^2$. The impurity may be introduced by a well-known ion implantation method or plasma doping method. Where such impurity ions are accelerated to a high energy and introduced, the dose is preferably between $0.8 \times 10^{15}$ and $1 \times 10^{17}/\text{cm}^2$. Also, a laser doping method using laser irradiation within an ambient of an impurity gas may be utilized. This method is described in Japanese Patent application Ser. No. 283981/1991, filed Oct. 4, 1991, and No. 290719/1991, filed Oct. 8, 1991. Preferably, the sheet resistance of these portions is less than 1 kΩ/cm².

Elements which can be added to the semiconductor layer are phosphorus, boron, arsenic, and others. Those portions of the semiconductor layer which are in contact with the conductive interconnects may be parts of doped regions such as the source and drain regions of the TFTs. Preferably, the sheet resistance of the semiconductor layer is less than 500 Ω/.

A silicon oxide layer may be in intimate contact with the bottom surface of the thin semiconductor layer. In this structure, the silicon oxide film may contain the same impurity as the impurity contained in the semiconductor layer.

In the first layer of the above-described first embodiment, the ratio of the titanium to the nitrogen contained as main constituents may differ according to the thickness. Besides titanium and nitrogen, other elements such as silicon and oxygen can be contained as main constituents. For example, that portion of the first layer which is close to the semiconductor layer may consist principally of titanium and silicon. That portion of the first layer which is close to the second layer may consist mainly of titanium and nitrogen. For instance, the ratio of nitrogen to titanium may be set close to a stoichiometric ratio (exceeding 0.8). In the intermediate region, the constituents may be made to vary continuously.

Generally, a stoichiometric material (titanium nitride) containing nitrogen and titanium has excellent barrier characteristics and prevents diffusion of aluminum and silicon. However, the material shows a high contact resistance with silicon. Therefore, it is not desired to use such a material directly for formation of contacts. On the other hand, a stoichiometric material (titanium silicide) containing titanium and silicon exhibits a low contact resistance with the semiconductor layer consisting mainly of silicon. This is advantageous to form Ohmic contacts. However, aluminum tends to easily diffuse. For example, the aluminum of the second layer diffuses through the first layer, thus forming aluminum silicide in the semiconductor layer.

The complex layer structure described above has been formed to solve these problems. In particular, that portion which is in contact with the second layer is made of substantially stoichiometric titanium nitride and hence the titanium nitride has excellent barrier characteristics. This prevents the aluminum of the second layer from diffusing into the first layer. The portion in contact with the semiconductor layer is made of substantially stoichiometric titanium silicide. Thus, good Ohmic contacts can be derived.

When a film of titanium silicide is formed, it is not necessary to intentionally add silicon. Titanium reacts with the silicon contained in the semiconductor layer. As a result, titanium silicide is automatically formed. For example, therefore, similar effects can be produced by depositing titanium containing less nitrogen onto the portion close to the semiconductor layer and depositing titanium containing more nitrogen onto the portion close to the second layer.

In either case, when the whole first layer is viewed, it consists mainly of titanium and nitrogen. Preferably, the ratio of nitrogen to titanium in the first layer is 0.5 to 1.2. This material containing titanium and nitrogen as main constituents can make Ohmic contacts with a conductive oxide such as indium tin oxide, zinc oxide, and nickel oxide. Where aluminum and such a conductive oxide together form a junction, a thick layer of aluminum oxide is formed at this junction, and it is impossible to have good contacts. In the prior art techniques, a chromium layer has been formed between aluminum and a conductive oxide. Since the chromium is poisonous, alternative materials have been sought for. Materials used in the present invention and consisting mainly of titanium and nitrogen are excellent also in this respect.

Other objects and features of the invention will appear in the course of the description thereof, which follows.

DETAILED DESCRIPTION OF THE INVENTION

EXAMPLE 1

Figure 1A:
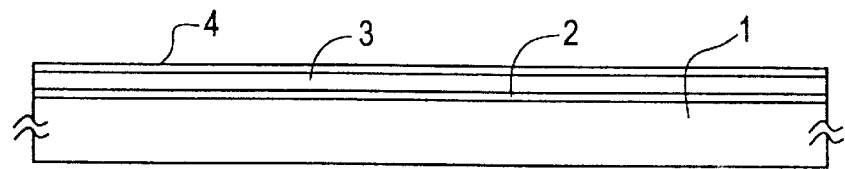
FIGS. 1(A) to 1(D) are cross sections of a circuit using TFTs according to the invention, illustrating the sequence in which the circuit is fabricated.
Figure 1B:
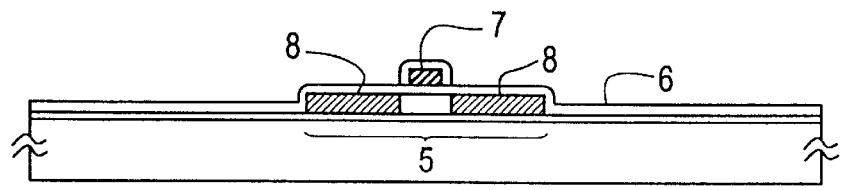

Example 1 is shown in FIGS. 1, (A)–(D), and 2, (A)–(B). FIGS. 1, (A)–(D), illustrate the sequence in which an electronic circuit having TFTs is fabricated. Description of conventional steps is omitted. First, silicon oxide was deposited as a silicon oxide film 2 forming a base film on a glass substrate 1 made of Corning 7059. An amorphous silicon film 3 having a thickness of 500 to 1500 Å, preferably 500 to 750 Å, was formed on the silicon oxide film 2. A protective layer 4 was formed on the amorphous silicon film 3. The laminate was annealed at 450 to 600° C. for 12 to 48 hours to crystallize the amorphous silicon film. Of course, laser annealing or other similar means can be used for the crystallization (FIG. 1(A)).

The silicon film was photolithographically patterned into island-shaped semiconductor regions 5. A silicon oxide film 6 having a thickness of 500 to 1500 Å, preferably 800 to 1000 Å, was formed on the semiconductor regions 5 to form a gate oxide film. Then, gate interconnects and electrodes 7 were fabricated from aluminum. The aluminum interconnects and electrodes 7 were anodized to form an aluminum oxide coating around the interconnects and electrodes 7. This technique which makes use of anodization for top-gate TFTs in this way is described in Japanese Patent application Ser. No. 38637/1992, filed Jan. 24, 1992. Of course, the gate electrodes can be made of silicon, titanium, tantalum, tungsten, molybdenum, or other material. Thereafter, using the gate electrodes as a mask, an impurity such as phosphorus was implanted by plasma doping or other method to form doped silicon regions 8 aligned with the gate electrodes 7. Then, the doped regions 8 were recrystallized by thermal annealing, laser annealing, or other method to form source and drain regions of TFTs (FIG. 1(B)).

Then, silicon oxide was deposited as an interlayer insulator 9. A conductive transparent oxide such as ITO (indium tin oxide) was deposited. The ITO film was photolithographically patterned into pixel electrodes 10 of an active-matrix liquid crystal display. Contact holes were formed in the interlayer insulator 9 to expose parts of the doped regions, or the source and drain regions. A first layer consisting mainly of titanium and nitrogen was formed by sputtering. Also, a second layer made of aluminum was formed by sputtering in the manner described below.

A target made of titanium was placed in a sputter chamber. Films were formed within argon ambient. The sputtering pressure was 1 to 10 mtorr. First, a layer having titanium as its main constituent but containing little nitrogen was formed up to a thickness of 50 to 500 Å. Besides argon, nitrogen was introduced into the sputter chamber. Within this ambient, a film was formed by sputtering. As a result, a layer of substantially stoichiometric titanium nitride and having a thickness of 200 to 1000 Å was formed. At this time, the percentage of nitrogen in the sputtering ambient was in excess of 40%. It is to be noted that the deposition rate by sputtering is affected greatly by the partial pressure of the nitrogen as well as by the sputtering pressure. For example, the deposition rate within an ambient consisting only of argon is generally 3 to 5 times as high as the deposition rate within an ambient containing more than 20% nitrogen. With respect to the sputtering ambient, ammonia, hydradine, or other substance can be used instead of nitrogen. It is known that the resistivity of the produced film varies, depending on the partial pressure of nitrogen during sputtering. Since the film is used to form conductive interconnects, a lower resistivity is desired. For this purpose, of course, an optimum partial pressure of nitrogen is adopted. For example, an ambient containing 100% nitrogen produces a lower resistivity than the resistivity obtained within an ambient containing 40% nitrogen. Typical resistivities were between 50 and 300 $\mu\Omega$ cm.

In the steps described above, if the titanium layer which was formed first and contained little nitrogen was too thick, reaction with the underlying layer occurred. This made it impossible to obtain good contacts. our research has demonstrated that if the titanium layer is thinner than the semiconductor layer, then favorable results are obtained.

After forming a first layer 11 in this way, aluminum was sputtered to form a second layer 12 containing 1% silicon. The thickness of this second layer was 2000 to 5000 Å. These layers were photolithographically patterned. More specifically, the second layer of aluminum was etched with an etchant such as a mixture acid of phosphoric acid, acetic acid, and nitric acid. Subsequently, the first layer was etched with buffered hydrofluoric acid or nitrous acid while leaving behind the photoresist on the aluminum film. At this time, the interlayer insulator was deteriorated by overetching. The etching process might also be carried out by etching the first layer with a mixture of aqueous solution of hydrogen peroxide ($H_2O_2$) and aqueous ammonia ($NH_3OH$), using the aluminum layer selectively left first as a mask. In this case, the interlayer insulator was not affected. However, organic materials such as the photoresist were oxidized.

The above-described etching step can be a dry etching process. If carbon tetrachloride ($CCl_4$) is used as an etching gas, the second and first layers can be continuously etched without adversely affecting the silicon oxide. In this way, conductive interconnects extending from the doped regions were formed. Then, the laminate was annealed at 300° C. within an ambient of hydrogen, thus completing TFTs.

Figure 2A:
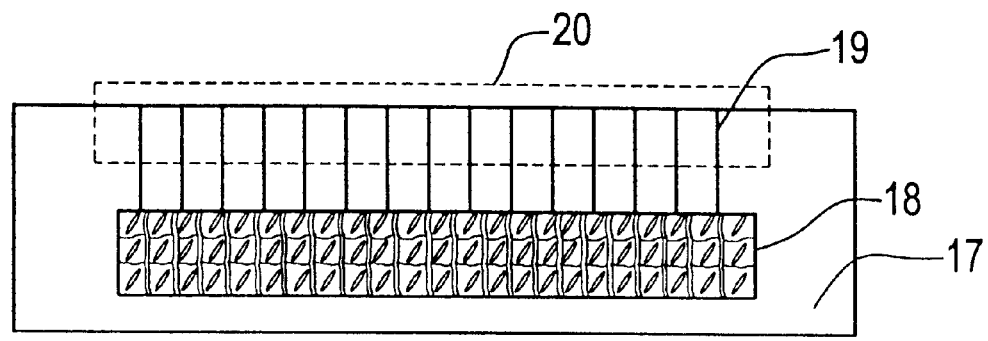
FIG. 2(A) is a vertical cross section of an electronic circuit according to the invention.

The circuit fabricated in this way had portions which were required to be connected to the outside. FIG. 2(A) shows the manner in which conductive interconnects 19 for connection with the outside extend from an integrated circuit 18 toward substrate peripheral portions, the circuit 18 being formed on a substrate 17. This electronic circuit may sometimes make electrical contact by mechanical means such as contact fixtures (e.g., sockets) in regions 20 surrounded by the broken line.

Figure 2B:
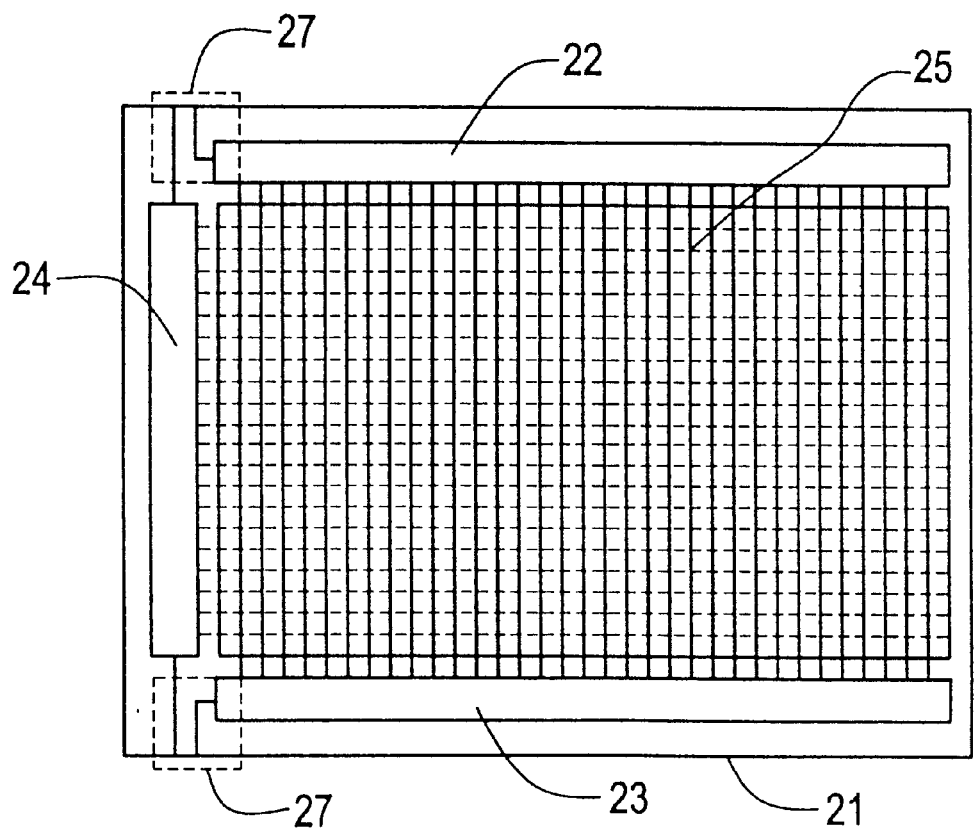
FIG. 2(B) is a top view of another electronic circuit according to the invention.

In a liquid crystal display as shown in FIG. 2(B), circuits 22–24 activate an active-matrix region 25 on a substrate 21. In order to supply electric power and signals to the circuits 22–24, electrical contacts are made in regions 27 surrounded by the broken lines. Connections made by wire bonding function permanently and are highly reliable. However, considerable labor is needed to fabricate the connections. Especially, this method is not suited for connection of numerous terminals. Therefore, use of mechanical contacts may sometimes be more advantageous.

In this case, however, it is necessary that the surfaces of the conductive interconnects at the contacts be sufficiently strong and that the underlying layer adhere well to the conductive interconnects. Aluminum is not suitable for these purposes. A material consisting mainly of titanium adheres well to silicon, silicon oxide, aluminum, and other similar materials. Also, the hardness of the coating of this material is high. Hence, this material is adequate. It is possible that nitrogen be not contained at all. Also, a maximum amount of nitrogen up to its stoichiometric ratio can be contained. In the present example, of the first layer 11, only the contacts were etched to expose the second layer. In the present example, those portions of the first layer which were in contact with the second layer were made of stoichiometric titanium nitride. Contact fixtures 13 were pressed against the exposed portions of the titanium nitride to form contacts (FIG. 1(C)).

Figure 1C:
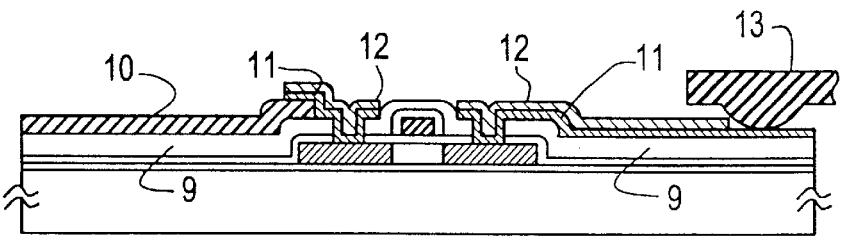
Figure 1D:
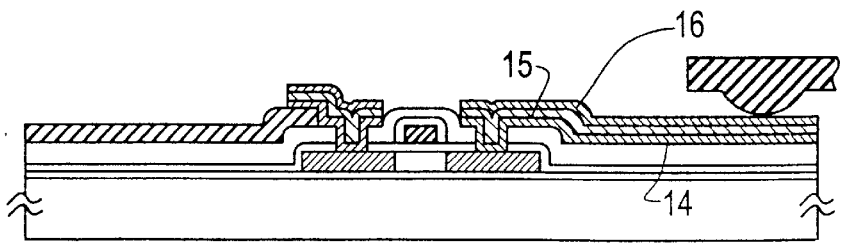

Alternatively, as shown in FIG. 1(D), a second layer 15 is formed on a first layer 14. A third layer 16 of titanium nitride is formed on the second layer 15. Contact fixtures may be brought into contact with this third layer. In this case, it is not necessary to partially etch the second layer as shown in FIG. 1(C). Hence, the patterning step can be omitted. Furthermore, as shown in FIG. 1(E), a layer consisting mainly of nitrogen and titanium according to the present invention is first photolithographically patterned into conductive interconnects, and then an ITO film is formed. In either case, in the present example, the ITO film is made of a material consisting principally of nitrogen and titanium. Consequently, good contacts can be obtained. The material of the film is not restricted to ITO. Rather, various other conductive oxides may also be used.

Figure 3:
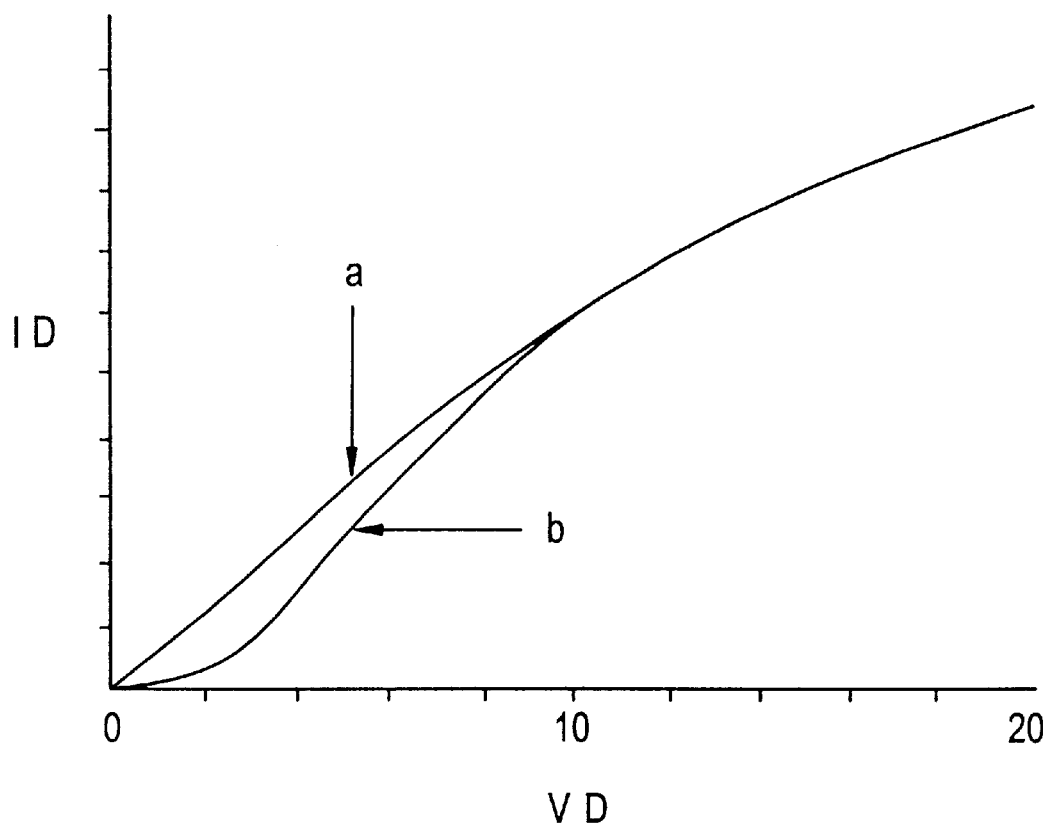
FIG. 3 is a graph illustrating the characteristic curve a of TFTs fabricated according to the invention, as well as the characteristic curve b of TFTs fabricated by the prior art method.

The $V_D$-$I_D$ characteristic of the TFTs obtained in this way is shown as curve a in FIG. 3. For reference, the $V_D$-$I_D$ characteristic of TFTs having conventional Al/Si contacts is shown as curve b in FIG. 3. A kink is observed close to $V_D$=0 on the curve b of the TFTs manufactured by the prior art method. Their contact resistances do not make Ohmic contact. On the other hand, such abnormality is not observed on the curve a of the TFTs manufactured according to the present invention, and normal MOS FET characteristics are exhibited.

Figure 4A:
FIGS. 4(A) and 4(B) are photographs of contact holes in TFTs.
Figure 4B:
Figure 5A:
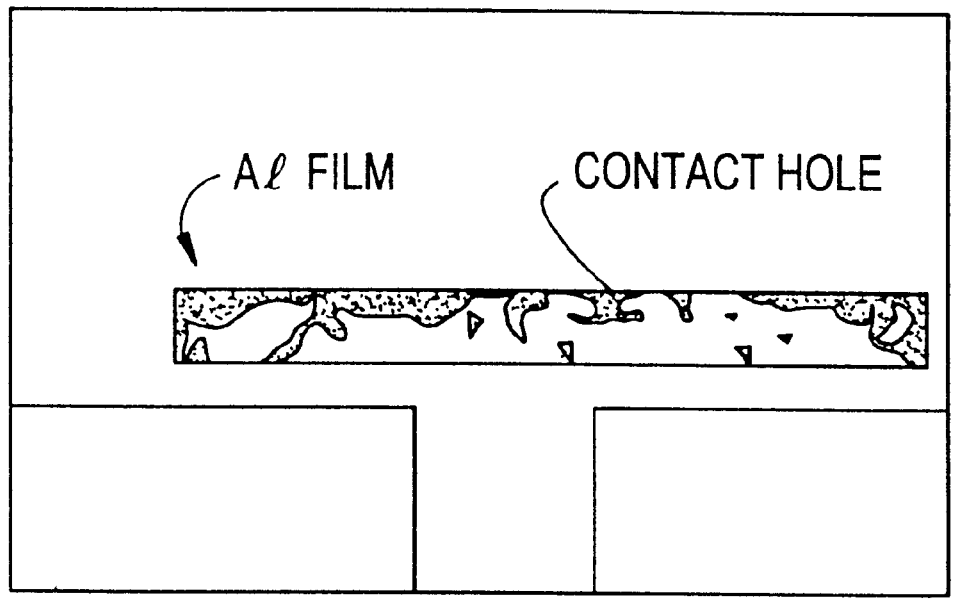
FIG. 5(A) is a schematic view illustrating the contact hole shown in FIG. 4(A)
Figure 5B:
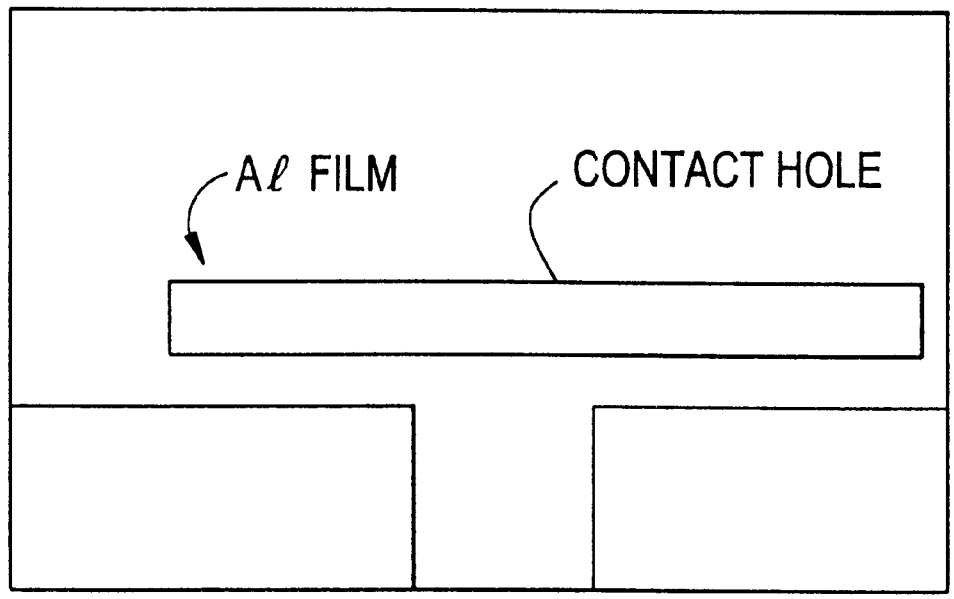
FIG. 5(B) is a schematic view illustrating the contact hole shown in FIG. 4(B)

FIGS. 4(A) and 4(B) are photographs demonstrating that alloying (i.e., formation of a silicide) of the materials of the conductive interconnects extending from the TFTs, i.e., aluminum, with the N-type silicon in the source and drain regions is suppressed under the same conditions as in Example 1. The regions shown in the photographs of FIGS. 4(A) and 4(B) are schematically shown in FIGS. 5(A) and 5(B), respectively. A rectangular region seen at the center of each photograph is a contact hole. After formation of the contact, the laminate was annealed at 300° C. for 30 minutes. Where no titanium nitride existed between the silicon and the aluminum as shown in FIG. 4(A), a large amount of silicide (specks) was produced at the contacts. Where a film of titanium nitride having a thickness of 1000 521 existed as shown in FIG. 4(B), any deterioration was not observed at all.

EXAMPLE 2

The present example is described by referring to FIG. 1, (A)–(D), which conceptually illustrate the sequence in which an electronic circuit having TFTs is fabricated. Conventional steps are not described herein. First, silicon oxide was deposited as a silicon oxide base film 2 on a glass substrate 1. An amorphous silicon film 3 having a thickness of 100 to 1500 Å, preferably 100 to 750 Å, was formed on the silicon oxide film 2. A protective layer 4 was formed on the amorphous silicon film 3. The laminate was annealed at 450 to 600° C. for 12 to 48 hours to crystallize the amorphous silicon film. Of course, laser annealing or other similar means can also be used for the crystallization (FIG. 1(A)).

The silicon film was photolithographically patterned into island-shaped semiconductor regions 5. A silicon oxide film 6 having a thickness of 500 to 1500 Å, preferably 800 to 1000 Å, was formed on the semiconductor regions 5 to form a gate oxide film. Then, gate interconnects and electrodes 7 were fabricated from aluminum. The aluminum interconnects and electrodes 7 were anodized to form an aluminum oxide coating around the interconnects and electrodes 7. Thereafter, using the gate electrodes as a mask, an impurity such as phosphorus was introduced by ion implantation or other method to form doped silicon regions 8 aligned with the gate electrodes 7. The dose, the accelerating voltage, and the thickness of the gate oxide film were so set that the dose was 0.8 to $4 \times 10^{15}/cm^2$ and that the dopant density was $1 \times 10^{19}$ to $1 \times 10^{21}/cm^3$. Then, the doped regions 8 were recrystallized by thermal annealing, laser annealing, or other method to form source and drain regions of TFTs (FIG. 1(B)).

Then, silicon oxide was deposited as an interlayer insulator 9, followed by deposition of ITO. The ITO film was photolitho-graphically patterned into pixel electrodes 10 of an active-matrix liquid crystal display. Contact holes were formed in the interlayer insulator 9 to expose parts of the doped regions, or the source and drain regions. A first layer consisting mainly of titanium and nitrogen was formed by sputtering. Also, a second layer made of aluminum was formed by sputtering in the manner described below.

A target made of titanium was placed in a sputter chamber. Films were formed within an ambient consisting of argon and nitrogen. The ratio of the partial pressure of the argon to the partial pressure of the nitrogen was less than 0.3, for example 0.25. The sputtering pressure was 3 mtorr. A DC current of 4.5 A was passed. The flow rate of the argon was 24 SCCM. The flow rate of the nitrogen was 6 SCCM. The first layer had a lower layer containing less nitrogen, the lower layer having a thickness of 100 Å. The film formed in this way showed sufficiently small contact resistance with the silicon and ITO.

Then, the percentage of the ambient within the sputter chamber was increased such that the ratio of the partial pressure of the argon to the partial pressure of the nitrogen was in excess of 0.3, for example 1. Within this ambient, a film was formed by sputtering. The sputtering pressure and the DC current were maintained at 3 mtorr and 4.5 A, respectively. The flow rates of the argon and the nitrogen were set to 15 SCCM. By the steps described above, an upper layer (having a thickness of 900 Å) of the first layer was formed. The film formed in this manner showed a large contact resistance with the silicon and so could not be used as contacts. However, this film could be patterned into conductive interconnections without difficulty in the present example. It is to be noted that the deposition rate by sputtering is affected greatly by the partial pressure of the nitrogen as well as by the sputtering pressure. For example, where the ratio of argon to nitrogen was 4:1, the deposition rate was 100 to 120 Å/min. Where the ratio of argon to nitrogen was 1:1, the deposition rate was 30 to 40 Å/min.

After forming the first layer 11 in this way, aluminum was sputtered to form a second layer 12 containing 1% silicon. The thickness of this second layer was 2000 to 5000 Å. These layers were photolithographically patterned. More specifically, the second layer of aluminum was etched with an etchant such as a mixture acid of phosphoric acid, acetic acid, and nitric acid. Subsequently, the first layer was etched with a mixture liquid of aqueous solution of hydrogen peroxide ($H_2O_2$) and aqueous ammonia ($NH_3OH$) while leaving behind the photoresist on the aluminum film. Since this etchant oxidizes organic substances, it follows that a final cleaning of organic substances is simultaneously done. In this way, conductive interconnects extending from the doped regions were formed. Then, the laminate was annealed at 300° C. within an ambient of hydrogen, thus completing TFTS. In the present example, of the first layer 11, only the contacts were etched, thus exposing the second layer. Contact fixtures 13 were pressed against the exposed portions of the first layer to form contacts (FIG. 1(C)).

EXAMPLE 3

The present example is shown in FIGS. 7, (A)–(H). First, silicon oxide was deposited as a silicon oxide film 202 on a glass substrate 201 made of Corning 7059. The silicon oxide film formed a base film and had a thickness of 1000 to 3000 Å. The substrate measured 300 mm×400 mm or 100 mm×100 mm. To form this oxide film, sputtering was effected within oxygen ambient. To make mass production more efficient, TEOS may be decomposed and deposited by plasma CVD.

Then, amorphous silicon was deposited as a film having a thickness of 300 to 5000 Å, preferably 500 to 1000 Å, by plasma CVD or LPCVD. This film was allowed to stand within an oxidizing ambient at 550 to 600° C. for 24 hours to crystallize the film. This step may also be carried out by laser irradiation. The crystallized silicon film was photolithographically patterned into island-shaped regions 203. A silicon oxide film 104 having a thickness of 700 to 1500 Å was formed by sputtering techniques.

An aluminum film having a thickness of 1000 Å to 3 $\mu$m was then formed by electron-beam evaporation or sputtering. This aluminum film contained 1% by weight of silicon or 0.1 to 0.3% by weight of scandium. A film of photoresist, such as OFPR800/30 cp prepared by TOKYO OHKA KOGYO CO., LTD., was formed by spin coating. If a film of aluminum oxide having a thickness of 100 to 1000 Å was formed by anodization before the formation of the photoresist film, then the aluminum film adhered well to the photoresist film. Also, leakage of electric current from the photoresist layer was suppressed. This was effective in forming porous anodized oxide in a subsequent anodization step. Thereafter, the photoresist film and the aluminum film were photolithographically patterned and etched to form gate electrodes 205 and a masking film 200 (FIG. 7(A)).

The gate electrodes 205 were anodized by passing an electric current through an electrolytic solution to form an anodic oxide film 206 having a thickness of 3000 to 6000 Å, for example 5000 Å. The anodization step was carried out, using an acidic solution of 3 to 20% of citric acid, nitric acid, phosphoric acid, chromic acid, sulfuric acid, or other acid, and by applying a constant voltage of 10 to 30 V to the gate electrodes. In the present example, a voltage of 10 V was applied to the gate electrodes in oxalic acid at 30° C. for 20 to 40 minutes for anodic oxidation. The thickness of the anodic oxide film was controlled by the anodization time (FIG. 7(B)).

Subsequently, the silicon oxide film 104 was etched by dry; etching techniques. In this etching step, either plasma mode of isotropic etching or reactive ion etching mode of anisotropic etching can be used. However, it is important that the active layer be etched not deeply by setting large the selection ratio of the silicon to the silicon oxide. For example, if $CF_4$ is used as an etching gas, the anodic oxide film is not etched; only the silicon oxide film 104 is etched. The silicon oxide film 204 located under the porous anodic oxide film 206 was not etched but left behind (FIG. 7(C)).

An electric current was again supplied to each gate electrode within an electrolytic solution. At this time, ethylene glycol solution containing 3 to 10% tartaric acid, boric acid, or nitric acid was used. When the temperature of the solution was lower than room temperature, or about 10° C., a good oxide film was obtained. In this way, a barrier-type anodic oxide film 207 was formed on the top and side surfaces of the gate electrodes. The thickness of the anodic oxide film 207 was in proportion to the applied voltage. When the applied voltage was 150 V, the thickness of the formed anodic oxide film was 2000 Å. In the present example, the voltage was increased to 80–150 V. The value of the voltage was determined according to the required thickness of the anodic oxide film 207 (FIG. 7(D)).

Using the barrier-type anodic oxide film 207 as a mask, the porous anodic oxide film 206 was etched away. Then, using the gate electrode portions 205 and 207 and the gate-insulating film 204 as masks, an impurity was implanted by ion doping to form low-resistivity doped regions 208, 211 and high-resistivity doped regions 209, 210. The dose was 1 to $5 \times 10^{14}/cm^2$. The accelerating voltage was 39 to 90 kV. Phosphorus was used as the impurity (FIG. 7(E)).

An appropriate metal such as titanium, nickel, molybdenum, tungsten, platinum, or palladium was sputtered over the whole surface. For instance, a titanium film 212 having a thickness of 50 to 500 Å was formed over the whole surface. As a result, the metal film, the titanium film 212 in this example, was in intimate contact with the low-resistivity doped regions 208 and 211 (FIG. 7(F)).

Laser radiation emitted from a KrF excimer laser having a wavelength of 248 nm and a pulse width of 20 nsec was illuminated to activate the implanted impurity and to cause the metal film, or the titanium film, to react with the active layer, thus forming regions 213 and 214 of a metal silicide, or titanium silicide. The energy density of the laser radiation was 200 to 400 $mJ/cm^2$, preferably 250 to 300 $mJ/cm^2$. When the laser light was illuminated, if the substrate was heated to 200 to 500° C., then the peeling of the titanium film could be suppressed.

In the present example, an excimer laser was employed as described above. Of course, other laser can be used. Preferably, the used laser is a pulsed laser. If a CW laser is used, the illumination time is long and so the illuminated object expands due to heat. As a result, the object may peel off.

Usable pulsed lasers include infrared lasers such as an Nd:YAG laser (preferably Q-switched laser), visible light lasers such as those utilizing second-harmonic generation, and various UV lasers using excimers such as KrF, XeCl, and ArF. Where laser light is illuminated from above the metal film, it is necessary that the wavelength of the laser light be so selected that the light is not reflected from the metal film. However, where the metal film is quite thin, almost no problems take place. The laser light may also be illuminated from the side of the substrate. In this case, such laser light which is transmitted through the underlying silicon semiconductor layer is required to be selected.

The anneal can be a lamp anneal using illumination of visible light or near infrared light. Where a lamp anneal is conducted, light is illuminated in such a way that the surface of the illuminated object reaches about 600 to 1000° C. Where the temperature is 600° C., the illumination is continued for several minutes. Where the temperature is 1000° C., the illumination is carried out for tens of seconds. An anneal using infrared light such as infrared light of 1.2 $\mu$m is quite advantageous for the following reasons. The near infrared light is absorbed selectively by the silicon semiconductor layer and, therefore, the glass substrate is not heated very much. By setting each illumination time short, the substrate is heated to a less extent.

Then, the titanium film was etched by an etchant consisting of hydrogen peroxide, ammonia, and water at a rate of 5:2:2. The exposed layer and those portions of the titanium layer which were not contacted (e.g., the titanium film existing on the gate-insulating film 204 and on the anodic oxide film 207) were left in metal state. These portions could be removed by this etching. Since none of the titanium nitride films 213 and 214 were etched, they could be left behind (FIG. 7(G)).

Figure 7A:
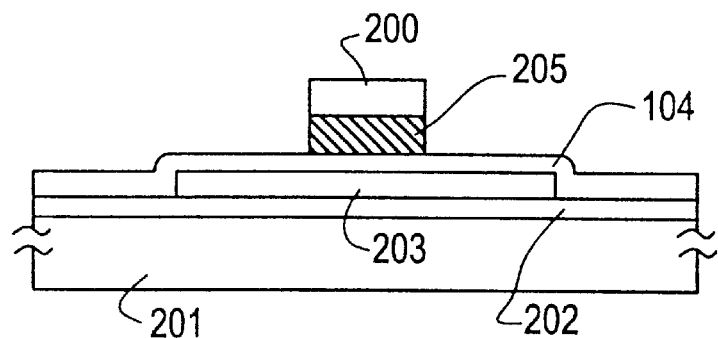
FIGS. 7(A) to 7(H) are cross sections of a TFT according to the invention, illustrating the sequence in which the TFT is fabricated.
Figure 7B:
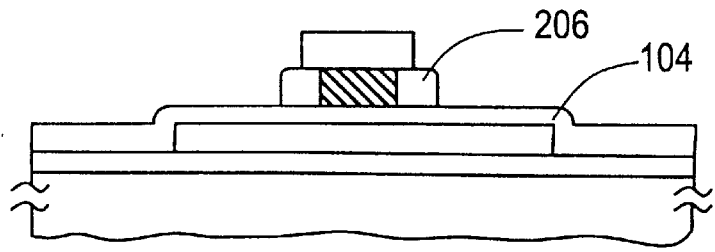
Figure 7C:
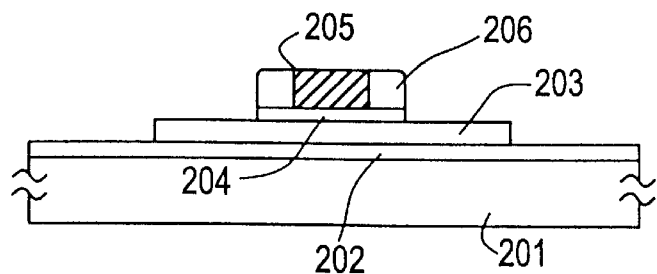
Figure 7D:
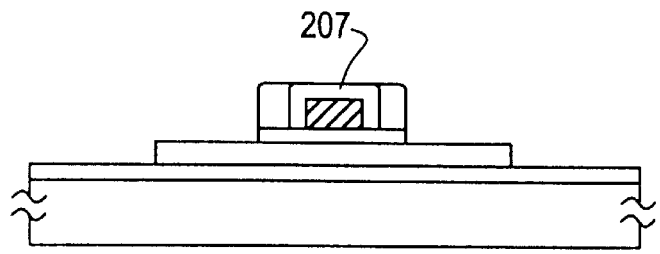
Figure 7E:
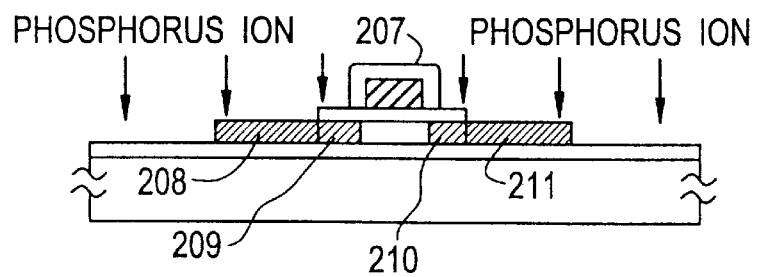
Figure 7F:
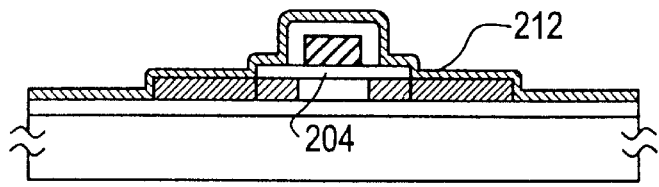
Figure 7G:
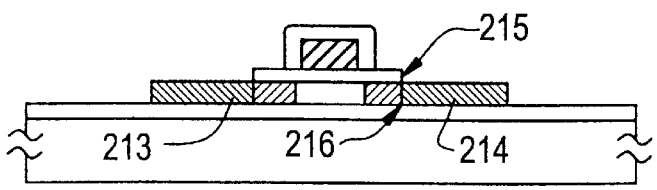
Figure 7H:
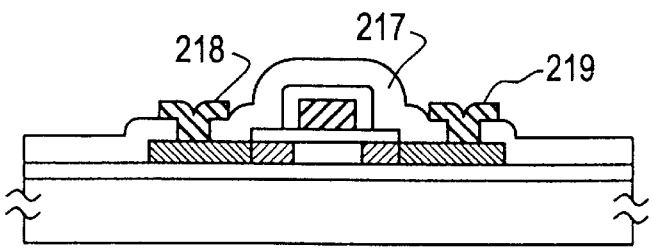

Finally, as shown in FIG. 7(H), a silicon oxide film having a thickness of 2000 Å to 1 $\mu$m (e.g., 3000 Å) was formed as an interlayer insulator 217 over the whole surface by CVD. Contact holes were formed in the source and drain electrodes of the TFTs. Aluminum interconnects and electrodes 218 and 219 having thicknesses of 200 Å to 1 $\mu$m (e.g., 5000 Å) were formed. In the present example, the portions with which the aluminum interconnects were in contact were made of titanium silicide. The stability at the interface with the aluminum is improved over the case of silicon. Hence, reliable contacts were obtained. If a barrier metal such as titanium nitride was deposited between the aluminum electrodes 218, 219 and the silicide regions 213, 214, the reliability could be improved further. In the present example, the sheet resistance of the silicide regions was 10 to 50 $\Omega/cm^2$. The sheet resistance of the high-resistivity regions 209 and 210 was 10 to 100 $k\Omega/cm^2$. As a result, TFTs which had good frequency characteristics and suffered from less hot carrier deterioration at high drain voltages could be fabricated. In the present example, the low-resistivity doped region 211 could be made substantially coincident with the metal silicide regions.

Figure 6:
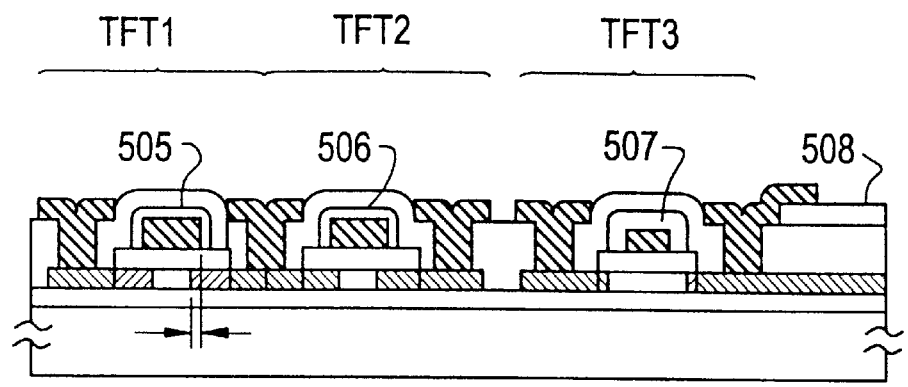
FIG. 6 is a schematic cross section of a device comprising a plurality of TFTs according to the invention, the TFTs being formed on a substrate.

FIG. 6 illustrates an example of fabrication of plural TFTs on a substrate, by the method illustrated in FIGS. 7, (A)–(H). In this example, three thin-film transistors TFT1–TFT3 were formed. The TFT1 and TFT2 were used as driver TFTs and took the form of CMOS devices. In the present example, these TFTs were built as inverters. Oxide layers 505 and 506 corresponding to the anodic oxide film 207 shown in FIGS. 7, (A)–(H), had a small thickness of 200 to 1000 Å, for example 500 Å. These oxide layers slightly overlapped the underlying layer. The TFT3 was used as a pixel TFT. An anodic oxide film 507 had a large value of 2000 Å and took an offset state, thus suppressing leakage current. One of the source/drain electrodes of the TFT3 was connected with the pixel electrode 508 of ITO. In order that the anodic oxide films had different thicknesses, they were separated to permit the voltages applied to the gate electrodes of the TFTs to be controlled independently. The TFT1 and TFT3 were n-channel thin-film transistors, while the TFT2 was a p-channel thin-film transistor.

In the present example, the step for forming the titanium film was carried out after the ion doping step. This sequence may be reversed. In this case, since the titanium film coats the whole underlying layer when ions are illuminated, abnormal charging, or charge-up, which would be produced on the substrate, is effectively prevented. As a modified example, after ion doping, a laser annealing step is carried out. Then, a titanium film is formed, and a titanium silicide film is formed by laser illumination or thermal annealing.

Figure 8A:
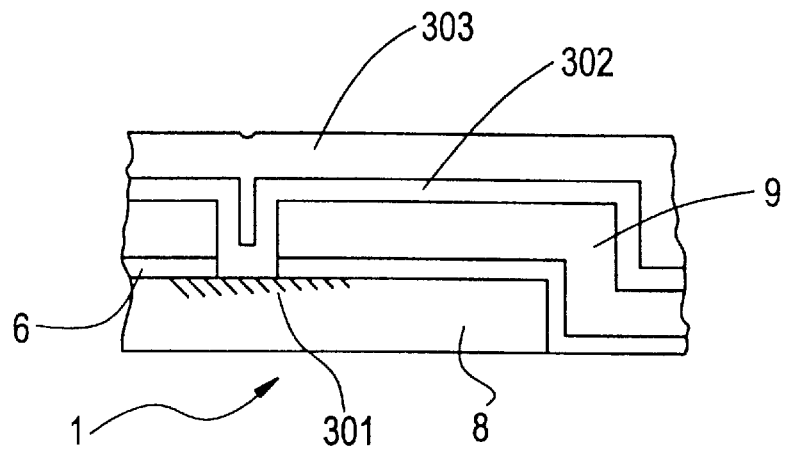
FIGS. 8(A) to 8(C) are cross sections of TFTs according to the invention, illustrating the contacts of the source or drain.
Figure 8B:
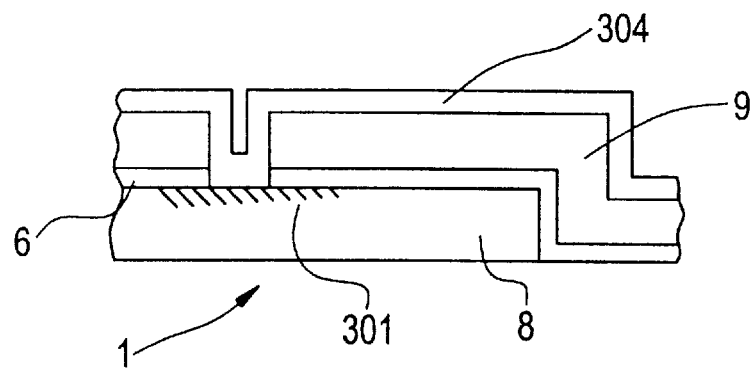
Figure 8C:
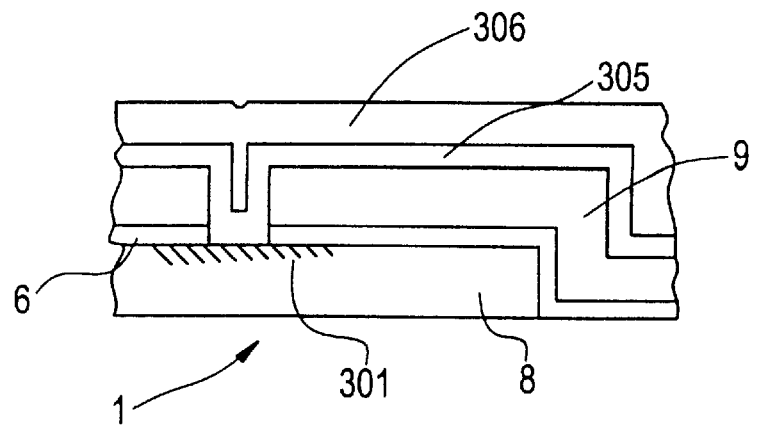

The contacts of the source or drain electrodes of the novel TFTs may take the structure shown in FIGS. 8(A)–8(C). Shown in these figures are a glass substrate 1, an insulating film 6, a source or drain 8, an interlayer insulating film 9, a titanium silicide region 301, a titanium nitride layer 302, an aluminum layer 303, a titanium nitride layer 304, a titanium layer 305, and a titanium nitride layer 306.

In the present invention, thin source, drain, or other doped regions, of TFTs can have good contacts, which are highly reliable and hence effective in enhancing the reliability of the whole electronic circuit. In this way, the invention is industrially advantageous.

What is claimed is:

1. A semiconductor device comprising:
    a pixel thin film transistor and a driver circuit for driving said pixel thin film transistor, said pixel thin film transistor comprising:
        a first semiconductor layer having at least a first low-resistivity impurity region and a first high-resistivity impurity region over a substrate;
        a first gate electrode adjacent to said first semiconductor layer with a gate insulating film interposed therebetween,
        wherein said first high-resistivity impurity region does not overlap with said first gate electrode, and
    said driver circuit comprising at least one thin film transistor, said at least one thin film transistor comprising:
        a second semiconductor layer having at least a second low-resistivity impurity region and a second high-resistivity impurity region over said substrate;
        a second gate electrode adjacent to said second semiconductor layer with a gate insulating film interposed therebetween,
        wherein said second high-resistivity impurity region has a region overlapping with said second gate electrode.

2. A semiconductor device according to claim 1, wherein said first low-resistivity impurity region is electrically connected to a pixel electrode comprising indium tin oxide.

3. A semiconductor device according to claim 1, wherein said first and said second semiconductor layers have a thickness of 1500 Å or less.

4. A semiconductor device according to claim 1, wherein said first and said second high-resistivity impurity regions have a sheet resistance of 10 to 100 k$\Omega$/cm$^2$.

5. A semiconductor device according to claim 1, wherein said first and said second gate electrodes comprise at least one selected from the group consisting of aluminum, silicon, titanium, tantalum, tungsten, and molybdenum.

6. A semiconductor device according to claim 1, wherein said semiconductor device is a liquid crystal display device.

7. A semiconductor device comprising:
    a pixel thin film transistor and a driver circuit for driving said pixel thin film transistor, said pixel thin film transistor comprising:
        a first semiconductor layer having at least a first low-resistivity impurity region and a first high-resistivity impurity region over a substrate;
        a first gate electrode adjacent to said first semiconductor layer with a gate insulating film interposed therebetween,
        wherein said first high-resistivity impurity region does not overlap with said first gate electrode, and
    said driver circuit comprising at least one thin film transistor, said at least one thin film transistor comprising:
        a second semiconductor layer having at least a second low-resistivity impurity region and a second high-resistivity impurity region over said substrate;
        a second gate electrode adjacent to said second semiconductor layer with a gate insulating film interposed therebetween,
        wherein said second high-resistivity impurity region has a region overlapping with said second gate electrode and has a region not overlapping with said second gate electrode.

8. A semiconductor device according to claim 7, wherein said first low-resistivity impurity region is electrically connected to a pixel electrode comprising indium tin oxide.

9. A semiconductor device according to claim 7, wherein said first and said second semiconductor layers have a thickness of 1500 Å or less.

10. A semiconductor device according to claim 7, wherein said first and said second high-resistivity impurity regions have a sheet resistance of 10 to 100 k$\Omega$/cm$^2$.

11. A semiconductor device according to claim 7, wherein said first and said second gate electrodes comprise at least one selected from the group consisting of aluminum, silicon, titanium, tantalum, tungsten, and molybdenum.

12. A semiconductor device according to claim 7, wherein said semiconductor device is a liquid crystal display device.

13. A semiconductor device comprising:
    a pixel thin film transistor and a driver circuit for driving said pixel thin film transistor, said pixel thin film transistor comprising:
        a semiconductor layer comprising a first impurity region and a second impurity region adjacent to said first impurity region over a substrate; and
        a gate electrode adjacent to said semiconductor layer with a gate insulating film interposed therebetween,
        wherein said first impurity region and said second impurity region do not overlap with said gate electrode, and
    said driver circuit comprising at least one thin film transistor, said at least one thin film transistor comprising:
        a semiconductor layer comprising a third impurity region and a fourth impurity region adjacent to said third impurity region over said substrate; and
        a gate electrode adjacent to said semiconductor layer with a gate insulating film interposed therebetween, wherein said third impurity region has a region overlapping with said gate electrode.

14. A semiconductor device according to claim 13, wherein said semiconductor layer has a thickness of 1500 Å or less.

15. A semiconductor device according to claim 13, wherein said first and said third impurity regions have a sheet resistance of 10 to 100 kΩ/cm².

16. A semiconductor device according to claim 13, wherein said gate electrode comprises at least one selected from the group consisting of aluminum, silicon, titanium, tantalum, tungsten, and molybdenum.

17. A semiconductor device according to claim 13, wherein said semiconductor device is a liquid crystal display device.

18. A semiconductor device comprising:
   a pixel thin film transistor and a driver circuit for driving said pixel thin film transistor, said pixel thin film transistor comprising:
      a semiconductor layer comprising a first impurity region and a second impurity region adjacent to said first impurity region over a substrate, said first impurity region having a higher sheet resistance than said second impurity region; and
      a gate electrode adjacent to said semiconductor layer with a gate insulating film interposed therebetween, wherein said first impurity region does not overlap with said gate electrode, and
   said driver circuit comprising at least one thin film transistor, said at least one thin film transistor comprising:
      a semiconductor layer comprising a third impurity region and a fourth impurity region adjacent to said third impurity region over said substrate, said third impurity region having a higher sheet resistance than said fourth impurity region; and
      a gate electrode adjacent to said semiconductor layer with a gate insulating film interposed therebetween, wherein said third impurity region has a region overlapping with said gate electrode.

19. A semiconductor device according to claim 18, wherein said semiconductor layer has a thickness of 1500 Å or less.

20. A semiconductor device according to claim 18, wherein said first and said third impurity regions have a sheet resistance of 10 to 100 kΩ/cm².

21. A semiconductor device according to claim 18, wherein said gate electrode comprises at least one selected from the group consisting of aluminum, silicon, titanium, tantalum, tungsten, and molybdenum.

22. A semiconductor device according to claim 18, wherein said semiconductor device is a liquid crystal display device.

23. A semiconductor device comprising:
   a pixel thin film transistor comprising:
      a semiconductor layer comprising a first impurity region and a second impurity region adjacent to said first impurity region over a substrate; and
      a gate electrode adjacent to said semiconductor layer with a gate insulating film interposed therebetween, wherein said first impurity region and said second impurity region do not overlap with said gate electrode, and
   a CMOS circuit comprising an n-channel thin film transistor and a p-channel thin film transistor, said n-channel thin film transistor comprising:
      a semiconductor layer comprising a third impurity region and a fourth impurity region adjacent to said third impurity region over said substrate; and
      a gate electrode adjacent to said semiconductor layer with a gate insulating film interposed therebetween,
      wherein said third impurity region has a region overlapping with said gate electrode.

24. A semiconductor device according to claim 23, wherein said semiconductor layer has a thickness of 1500 Å or less.

25. A semiconductor device according to claim 23, wherein said first and said third impurity regions have a sheet resistance of 10 to 100 kΩ/cm².

26. A semiconductor device according to claim 23, wherein said gate electrode comprises at least one selected from the group consisting of aluminum, silicon, titanium, tantalum, tungsten, and molybdenum.

27. A semiconductor device according to claim 23, wherein said semiconductor device is a liquid crystal display device.

28. A semiconductor device comprising:
   a pixel thin film transistor comprising:
      a semiconductor layer comprising a first impurity region and a second impurity region adjacent to said first impurity region over a substrate, said first impurity region having a higher sheet resistance than said second impurity region; and
      a gate electrode adjacent to said semiconductor layer with a gate insulating film interposed therebetween, wherein said first impurity region does not overlap with said gate electrode, and
   a CMOS circuit comprising an n-channel thin film transistor and a p-channel thin film transistor, said n-channel thin film transistor comprising:
      a semiconductor layer comprising a third impurity region and a fourth impurity region adjacent to said third impurity region over said substrate, said third impurity region having a higher sheet resistance than said fourth impurity region; and
      a gate electrode adjacent to said semiconductor layer with a gate insulating film interposed therebetween,
      wherein said third impurity region has a region overlapping with said gate electrode.

29. A semiconductor device according to claim 28, wherein said semiconductor layer has a thickness of 1500 Å or less.

30. A semiconductor device according to claim 28, wherein said first and said third impurity regions have a sheet resistance of 10 to 100 kΩ/cm².

31. A semiconductor device according to claim 28, wherein said gate electrode comprises at least one selected from the group consisting of aluminum, silicon, titanium, tantalum, tungsten, and molybdenum.

32. A semiconductor device according to claim 28, wherein said semiconductor device is a liquid crystal display device.

33. A semiconductor device comprising:
   a pixel thin film transistor comprising:
      a semiconductor layer comprising a first impurity region and a second impurity region adjacent to said first impurity region over a substrate; and
      a gate electrode adjacent to said semiconductor layer with a gate insulating film interposed therebetween, wherein said first impurity region and said second impurity region do not overlap with said gate electrode, and
   an inverter circuit comprising an n-channel thin film transistor and a p-channel thin film transistor, said n-channel thin film transistor comprising:

a semiconductor layer comprising a third impurity region and a fourth impurity region adjacent to said third impurity region over said substrate; and a gate electrode adjacent to said semiconductor layer with a gate insulating film interposed therebetween, wherein said third impurity region has a region overlapping with said gate electrode.

34. A semiconductor device according to claim 33, wherein said semiconductor layer has a thickness of 1500 Å or less.

35. A semiconductor device according to claim 33, wherein said first and said third impurity regions have a sheet resistance of 10 to 100 kΩ/cm$^2$.

36. A semiconductor device according to claim 33, wherein said gate electrode comprises at least one selected from the group consisting of aluminum, silicon, titanium, tantalum, tungsten, and molybdenum.

37. A semiconductor device according to claim 33, wherein said semiconductor device is a liquid crystal display device.

38. A semiconductor device comprising:

a pixel thin film transistor comprising:
  a semiconductor layer comprising a first impurity region and a second impurity region adjacent to said first impurity region over a substrate, said first impurity region having a higher sheet resistance than said second impurity region; and
  a gate electrode adjacent to said semiconductor layer with a gate insulating film interposed therebetween, wherein said first impurity region does not overlap with said gate electrode, and an inverter circuit comprising an n-channel thin film transistor and a p-channel thin film transistor, said n-channel thin film transistor comprising:
  a semiconductor layer comprising a third impurity region and a fourth impurity region adjacent to said third impurity region over said substrate, said third impurity region having a higher sheet resistance than said fourth impurity region; and
  a gate electrode adjacent to said semiconductor layer with a gate insulating film interposed therebetween,
  wherein said third impurity region has a region overlapping with said gate electrode.

39. A semiconductor device according to claim 38, wherein said semiconductor layer has a thickness of 1500 Å or less.

40. A semiconductor device according to claim 38, wherein said first and said third impurity regions have a sheet resistance of 10 to 100 kΩ/cm$^2$.

41. A semiconductor device according to claim 38, wherein said semiconductor device is a liquid crystal display device.

42. A semiconductor device according to claim 38, wherein said gate electrode comprises at least one selected from the group consisting of aluminum, silicon, titanium, tantalum, tungsten, and molybdenum.

* * * * *

UNITED STATES PATENT AND TRADEMARK OFFICE
CERTIFICATE OF CORRECTION

PATENT NO.    : 6,448,612 B1
DATED         : September 10, 2002
INVENTOR(S)   : Minoru Miyazaki et al.

It is certified that error appears in the above-identified patent and that said Letters Patent is hereby corrected as shown below:

Drawings,
Replace Figure 4A and Figure 4B with the following Figures 4A and 4B:

FIG. 4(A)

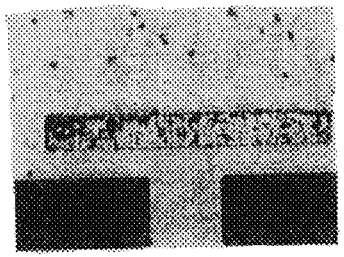

FIG. 4(B)

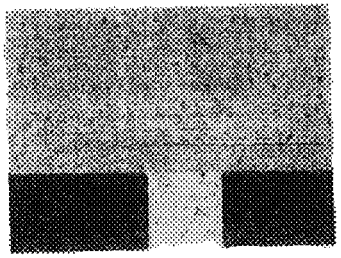

Signed and Sealed this

Twenty-seventh Day of July, 2004

JON W. DUDAS
*Acting Director of the United States Patent and Trademark Office*